(12) United States Patent
Nishita et al.

(10) Patent No.: US 11,675,270 B2
(45) Date of Patent: *Jun. 13, 2023

(54) RESIST UNDERLAYER FILM-FORMING COMPOSITION

(71) Applicant: NISSAN CHEMICAL CORPORATION, Tokyo (JP)

(72) Inventors: Tokio Nishita, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 416 days.

This patent is subject to a terminal disclaimer.

(21) Appl. No.: 16/332,219

(22) PCT Filed: Sep. 15, 2017

(86) PCT No.: PCT/JP2017/033521
§ 371 (c)(1),
(2) Date: Mar. 11, 2019

(87) PCT Pub. No.: WO2018/052127
PCT Pub. Date: Mar. 22, 2018

(65) Prior Publication Data
US 2019/0227438 A1    Jul. 25, 2019

(30) Foreign Application Priority Data
Sep. 15, 2016 (JP) .............................. JP2016-180835

(51) Int. Cl.
*G03F 7/11* (2006.01)
*G03F 7/09* (2006.01)
(Continued)

(52) U.S. Cl.
CPC .............. *G03F 7/11* (2013.01); *C08F 220/22* (2013.01); *C08F 220/24* (2013.01);
(Continued)

(58) Field of Classification Search
CPC ................................... G03F 7/11; G03F 7/091
See application file for complete search history.

(56) References Cited

U.S. PATENT DOCUMENTS 10,514,604 B2 * 12/2019 Hong ...................... G03F 7/095
10,539,870 B2 * 1/2020 Williams, III ........ C07C 269/04
(Continued)

FOREIGN PATENT DOCUMENTS

JP      2010-237491 A     10/2010
JP      2011-102974 A      5/2011
(Continued)

OTHER PUBLICATIONS

May 13, 2020 Office Action issued in U.S. Appl. No. 15/774,321.
Nov. 21, 2017 Search Report issued in International Patent Application No. PCT/JP2017/033521.
Nov. 21, 2017 Written Opinion issued in International Patent Application No. PCT/JP2017/033521.
Feb. 7, 2017 International Search Report issued in Internatioal Patent Application No. PCT/JP2016/083116.
Feb. 7, 2017 Written Opinion of the International Searching Authority issued in International Patent Application No. PCT/JP2016/083116.
(Continued)

*Primary Examiner* — John S Chu
(74) *Attorney, Agent, or Firm* — Oliff PLC

(57) ABSTRACT

A resist underlayer film-forming composition for lithography including a copolymer having a structural unit of the following Formula (1) to Formula (3), a crosslinking agent, an organic acid catalyst, and a solvent:

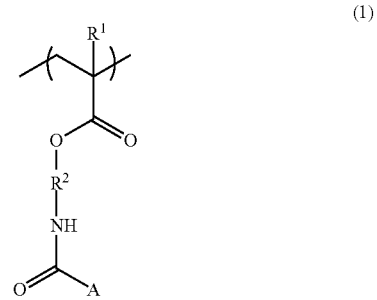

(1)

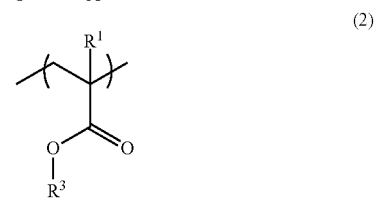

(2)

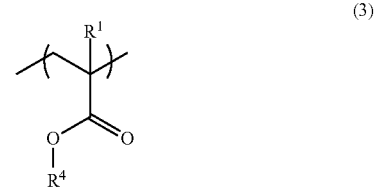

(3)

(wherein $R^1$s are independently a hydrogen atom or a methyl group, $R^2$ is a $C_{1-3}$ alkylene group, A is a protective group, $R^3$ is an organic group having a 4-membered ring to 7-membered ring lactone framework, adamantane framework, tricyclodecane framework or norbornane framework, $R^4$ is a linear, branched or cyclic organic group having a carbon atom number of 1 to 12 in which at least one hydrogen atom is substituted with a fluoro group and which optionally has at least one hydroxy group as a substituent).

7 Claims, No Drawings

(51) Int. Cl.

| | | |
|---|---|---|
| *C08F 220/22* | (2006.01) | |
| *C08F 220/24* | (2006.01) | |
| *C08F 220/30* | (2006.01) | |
| *C08F 220/36* | (2006.01) | |
| *C09D 133/14* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *C08F 220/18* | (2006.01) | |

(52) U.S. Cl.
CPC ...... *C08F 220/302* (2020.02); *C08F 220/365* (2020.02); *C09D 133/14* (2013.01); *G03F 7/162* (2013.01); *G03F 7/168* (2013.01); *G03F 7/2004* (2013.01); *G03F 7/2006* (2013.01); *G03F 7/322* (2013.01); *G03F 7/38* (2013.01); *C08F 220/1811* (2020.02); *C08F 220/301* (2020.02); *C08F 220/303* (2020.02); *C08F 2800/20* (2013.01)

(56) References Cited

U.S. PATENT DOCUMENTS

| | | | |
|---|---|---|---|
| 10,795,261 B2* | 10/2020 | Nishita | ............... G03F 7/11 |
| 2011/0091812 A1 | 4/2011 | Hatakeyama et al. | |
| 2012/0183903 A1* | 7/2012 | Hatakeyama | ......... G03F 7/2037 |
| | | | 430/284.1 |
| 2015/0086929 A1 | 3/2015 | Hatakeyama et al. | |
| 2015/0194312 A1 | 7/2015 | Someya et al. | |
| 2016/0147152 A1* | 5/2016 | Fujitani | ............... H01L 21/3065 |
| | | | 438/695 |
| 2017/0045818 A1* | 2/2017 | Karasawa | ............... G03F 7/162 |
| 2019/0227438 A1 | 7/2019 | Nishita et al. | |

FOREIGN PATENT DOCUMENTS

| | | | |
|---|---|---|---|
| JP | 2012-078815 A | | 4/2012 |
| JP | 2015-087749 A | | 5/2015 |
| KR | 10-2015-0022880 A | | 3/2015 |
| WO | 03/017002 A1 | | 2/2003 |
| WO | 2010/074075 A1 | | 7/2010 |
| WO | 2011/065207 A1 | | 6/2011 |
| WO | 2013/058189 A1 | | 4/2013 |
| WO | 2015/012172 A1 | | 1/2015 |
| WO | 2015/146443 A1 | | 10/2015 |
| WO | 2015/178235 A1 | | 11/2015 |
| WO | WO2015178235 A | * | 11/2015 |
| WO | 2017/086213 A1 | | 5/2017 |

OTHER PUBLICATIONS

Jan. 8, 2020 Office Action issued in U.S. Appl. No. 15/774,321.
English Translation of Text of WO 2011/065207 A1 from WIPO IP Portal generated by machine dated Jan. 2, 2020, 32 pages, (Year: 2020).
English Translation of Description of (JP Application No. 2011-193623 which published as JP 2012-078815 A), downloaded Jan. 3, 2020 from Global Dossier Website, 105 pages, (Year: 2020).
The U.S. Appl. No. 15/774,321, filed May 8, 2018 in the name of Tokio Nishita et al.

* cited by examiner

RESIST UNDERLAYER FILM-FORMING COMPOSITION

TECHNICAL FIELD

The present invention relates to a resist underlayer film-forming composition for lithography, and particularly to a composition for forming a resist underlayer film having improved adhesion to a resist pattern, and also relates to a resist underlayer film-forming composition having excellent coating properties with respect to a substrate even if a resist underlayer film with a thin film thickness (for example, 25 nm or less) is to be formed.

BACKGROUND ART

In ArF immersion lithography and extreme ultraviolet (EUV) lithography, a fine processing dimension of a resist pattern line width is required. When such a fine resist pattern is formed, if a contact area between a resist pattern and a base substrate is reduced, an aspect ratio of the resist pattern (the height of the resist pattern/the line width of the resist pattern) increases and there is a concern of the resist pattern being likely to collapse. Therefore, as to a resist underlayer film or an antireflective film in contact with the resist pattern, strong adhesion to the resist pattern is required in order to reduce the collapse.

It has been reported that, in a resist underlayer film, a resist underlayer film-forming composition having a lactone structure is used in order to exhibit strong adhesion to a resist pattern, and thereby adhesion to the obtained resist pattern is improved (Patent Document 1). That is, when a resist underlayer film-forming composition having a polar moiety such as a lactone structure is used, it is expected that adhesion to a resist pattern will be improved, and collapse of a resist pattern be prevented even in a fine resist pattern.

However, as in ArF immersion lithography and extreme ultraviolet (EUV) lithography, in a lithography process in which fabrication of a finer resist pattern is required, it cannot be said that having a lactone structure as a resist underlayer film-forming composition is sufficient to prevent collapse of a resist pattern.

In order to realize strong adhesion between a resist underlayer film and a resist pattern, Patent Document 2 describes an additive for a resist underlayer film-forming composition in which a surface state of the resist underlayer film is modified to a basic state and thus it is possible to suppress an edge shape of a resist pattern from becoming an undercut shape. On the other hand, Patent Document 3 describes an additive for a resist underlayer film-forming composition in which an additive component is segregated near the surface of a resist underlayer film and thus it is possible to suppress an edge shape of a resist pattern from becoming a footing shape.

Patent Document 4 describes an additive for a resist underlayer film-forming composition in which a surface state of a resist underlayer film is modified to a hydrophobic state, a Laplace force generated when a resist pattern is developed and rinsing is performed with pure water is reduced, and thus it is possible to improve adhesion of the resist pattern with respect to the resist underlayer film. On the other hand, Patent Document 5 describes an additive for a resist underlayer film-forming composition in which, in a resist pattern forming method in which an unexposed part of the resist film is removed using a solvent that can dissolve the resist film, and an exposed part of the resist film remains as a resist pattern, when the acidity near the surface of the resist underlayer film is adjusted, the cross-sectional shape of the resist pattern becomes a straight shape, and also, it is possible to improve adhesion of the resist pattern with respect to the resist underlayer film.

Patent Document 6 describes a resist underlayer film-forming composition for lithography including a copolymer having a structural unit in which a sulfo group is introduced at the terminal, a crosslinking agent, and a solvent. In addition, the invention described in Patent Document 6 has an effect of reducing the generation of a sublimate derived from a crosslinking catalyst component when a resist underlayer film is formed and can provide a resist underlayer film which can form a resist pattern with a favorable shape having substantially no trailing shape at the bottom.

PRIOR ART DOCUMENTS

Patent Documents

Patent Document 1: International Publication No. WO 03/017002

Patent Document 2: International Publication No. WO 2013/058189

Patent Document 3: International Publication No. WO 2010/074075

Patent Document 4: International Publication No. WO 2015/012172

Patent Document 5: International Publication No. WO 2015/146443

Patent Document 6: Japanese Patent Application Publication No. 2010-237491

SUMMARY OF THE INVENTION

Problem to be Solved by the Invention

In recent years, miniaturization of resist patterns has been increasingly accelerated. In order to suppress collapse of patterns due to miniaturization of resist patterns, an interaction between a resist underlayer film and a resist pattern has been focused on and various studies have been conducted. As one of the studies, a resist material component and a surface of a resist underlayer film are chemically bonded so that improvement in adhesion between the resist underlayer film and the resist pattern can be expected.

Thus, the present invention provides a resist underlayer film-forming composition that crosslinks with a resist material component in order to improve adhesion to a resist pattern.

Means for Solving the Problem

A first aspect of the present invention is a resist underlayer film-forming composition for lithography including a copolymer having a structural unit of the following Formula (1) to Formula (3), a crosslinking agent, an organic acid catalyst, and a solvent:

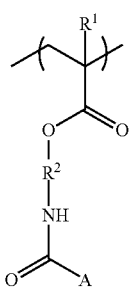
(1)

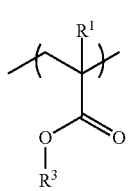
(2)

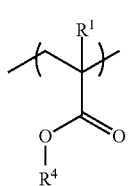
(3)

(wherein $R^1$s are independently a hydrogen atom or a methyl group, $R^2$ is a $C_{1-3}$ alkylene group, A is a protective group, $R^3$ is an organic group having a 4-membered ring to 7-membered ring lactone framework, adamantane framework, tricyclodecane framework or norbornane framework, $R^4$ is a linear, branched or cyclic organic group having a carbon atom number of 1 to 12 in which at least one hydrogen atom is substituted with a fluoro group and which optionally has at least one hydroxy group as a substituent).

The copolymer is optionally a copolymer having a structural unit of the following Formula (1), a structural unit of the following Formula (4), and a structural unit of the following Formula (3):

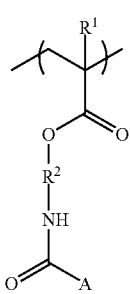
(1)

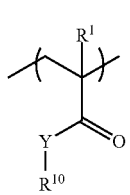
(4)

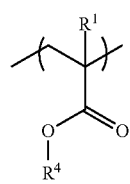
(3)

(wherein $R^1$ has the same meaning as $R^1$ in Formula (1), Formula (2), and Formula (3), $R^2$ and A have the same meanings as $R^2$ and A in Formula (1), Y is a —O-group or —NH-group, $R^{10}$ is a linear or branched alkyl group or hydroxyalkyl group having a carbon atom number of 1 to 12 in which at least one hydrogen atom is optionally substituted with a fluoro group or a chloro group and which optionally has a phenoxy group as a substituent, and $R^4$ has the same meaning as $R^4$ in Formula (3)).

The structural unit of Formula (1) is, for example, a structural unit of the following Formula (1a), a structural unit of the following Formula (1b), a structural unit of the following Formula (1c), or a structural unit of the following Formula (1d):

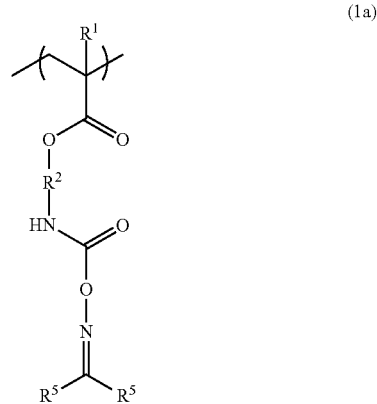
(1a)

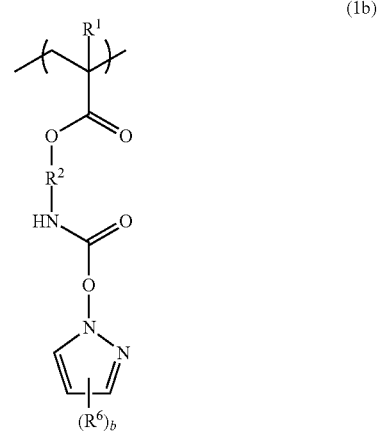
(1b)

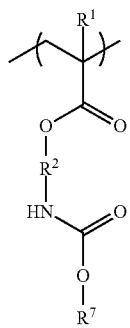

(1c)

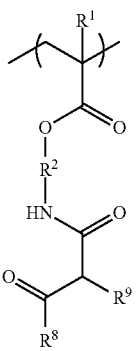

(1d)

(wherein $R^1$ and $R^2$ have the same meanings as $R^1$ and $R^2$ in Formula (1), two $R^5$s are independently a hydrogen atom, a methyl group or an ethyl group, $R^6$ is a methyl group or an ethyl group, b is an integer of 0 to 3, $R^7$ is a linear or branched alkyl group having a carbon atom number of 1 to 6 or a linear or branched alkoxyalkyl group having a carbon atom number of 1 to 6, $R^8$ is a linear or branched alkoxy group having a carbon atom number of 1 to 6, and $R^9$ is a hydrogen atom or a linear or branched alkoxycarbonyl group having a carbon atom number of 2 to 6).

For example, the weight average molecular weight of the copolymer is 1,500 to 20,000, and preferably 3,000 to 15,000. When the weight average molecular weight is smaller than 1,500, solvent resistance of a resist underlayer film formed from the resist underlayer film-forming composition containing the copolymer is not obtained. On the other hand, when the weight average molecular weight is larger than 20,000, there is a concern of solubility of the copolymer in the solvent to be deteriorated as the resist underlayer film-forming composition is prepared.

A second aspect of the present invention is a method of forming a resist pattern comprising; a process of applying the resist underlayer film-forming composition for lithography of the first aspect of the present invention to a substrate and performing baking to form a resist underlayer film with a thickness of 1 nm to 25 nm; a process of applying a resist solution to the resist underlayer film and performing heating to form a resist film; a process of exposing the resist film with radiated light selected from the group consisting of a KrF excimer laser, an ArF excimer laser and an extreme ultraviolet ray through a photomask; and a process of performing development with a developing solution after the exposure.

Effects of the Invention

When the resist underlayer film-forming composition according to the present invention is applied in a lithography process, an isocyanate group blocked by a protective group derived from a structural unit of Formula (1) of a copolymer contained in the composition is generated on the surface of the formed resist underlayer film. Then, during heating when a resist film is formed on the resist underlayer film, the protective group is deprotected and thus the generated isocyanate group (—N=C=O) chemically bonds with a resist material component. Therefore, adhesion between the resist underlayer film and the resist pattern is improved, and as a result, it is possible to prevent collapse of the resist pattern. In addition, when the resist underlayer film-forming composition according to the present invention is applied to as a thin film, it can be used for a process in which use of a resist underlayer film as an ultra-thin film is required such as an EUV lithography process.

MODES FOR CARRYING OUT THE INVENTION

[Copolymer] The copolymer used in the resist underlayer film-forming composition of the present invention is a copolymer having a structural unit of Formula (1) to Formula (3) or a copolymer having a structural unit of Formula (1), a structural unit of Formula (4), and a structural unit of Formula (3).

The structural unit of Formula (1) has an isocyanate group blocked by a protective group, and the protective group is deprotected by heating, and an isocyanate group is generated. Examples of such structural units include structural units of Formula (1-1) to Formula (1-20) below.

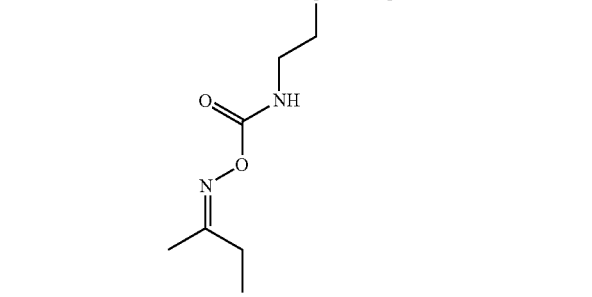

(1-1)

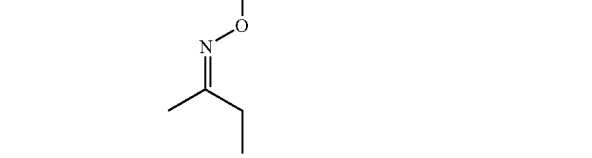

(1-2)

(1-3)
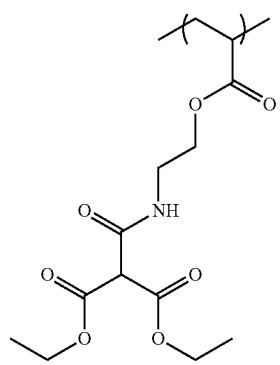
(1-4)
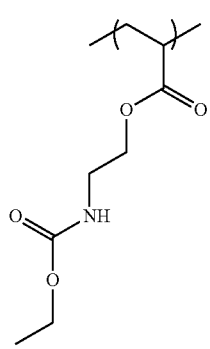
(1-5)
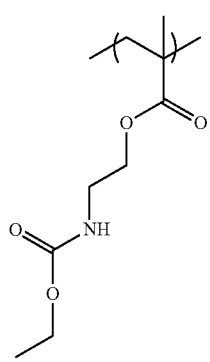
(1-6)
(1-7)
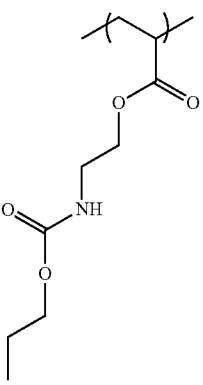
(1-8)
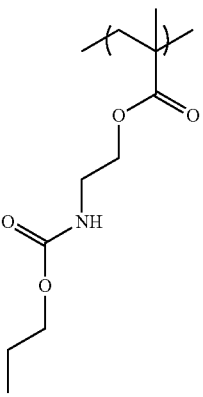
(1-9)
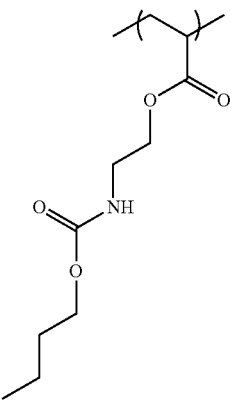
(1-10)

(1-11)
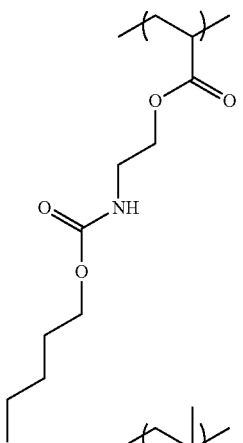
(1-12)
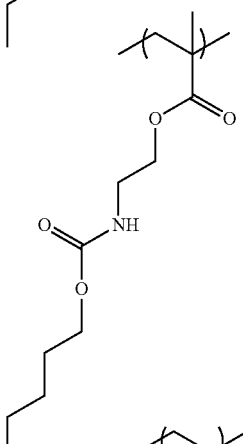
(1-13)
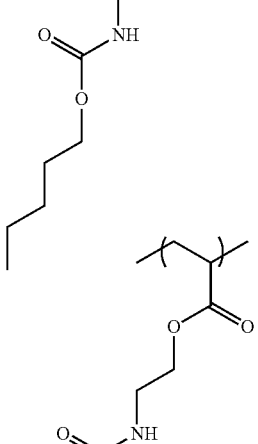
(1-14)
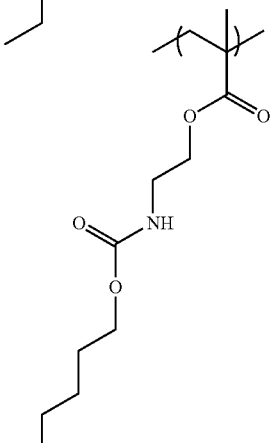
(1-15)
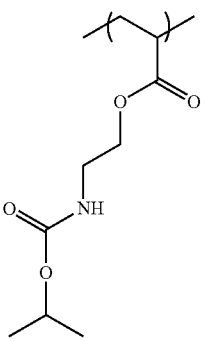
(1-16)
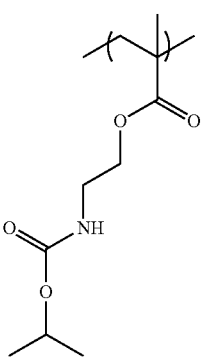
(1-17)
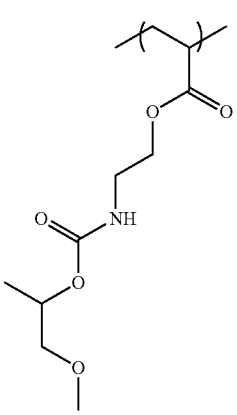
(1-18)
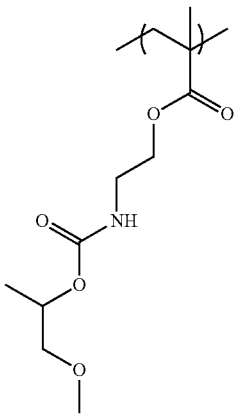

(1-19)
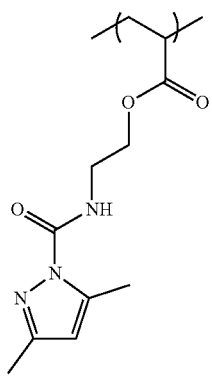
(1-20)
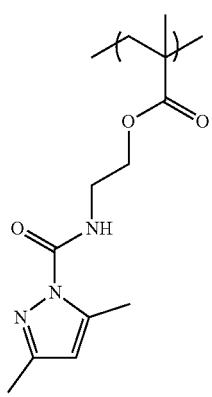
Examples of the structural unit of Formula (2) include structural units of Formula (2-1) to Formula (2-16) below. As R³ in the structural unit of Formula (2), an organic group having a framework (cyclic structure) introduced into a polymer in a resist solution is selected.
(2-1)
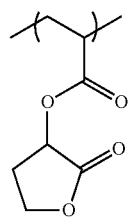
(2-2)
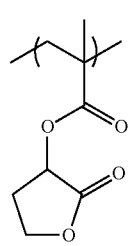
(2-3)
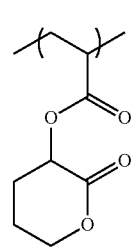
(2-4)
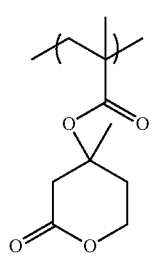
(2-5)
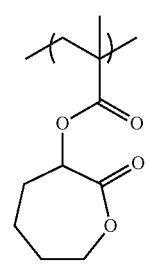
(2-6)
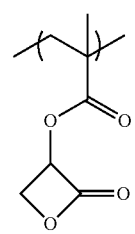
(2-7)
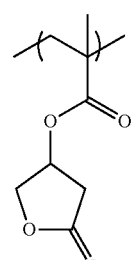
(2-8)
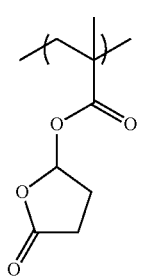

(2-9) 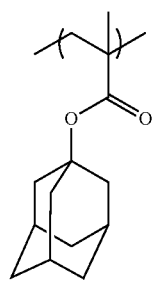
(2-10) 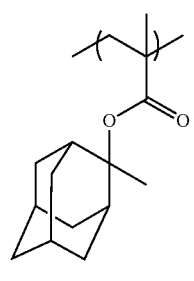
(2-11) 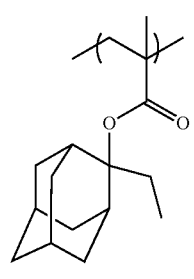
(2-12) 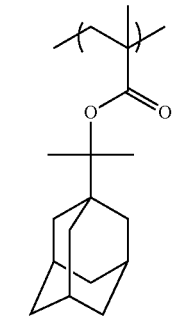
(2-13) 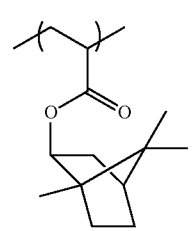
(2-14) 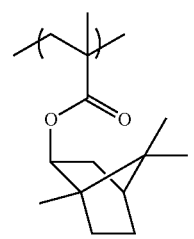
(2-15) 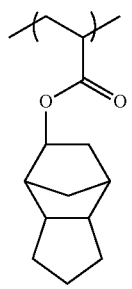
(2-16) 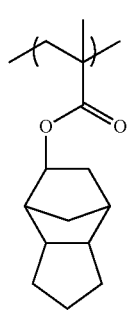
Examples of the structural unit of Formula (3) include structural units of Formula (3-1) to Formula (3-6) below. The structural unit of Formula (3) has a function of making a film made of a composition containing a copolymer having the structural unit hydrophobic and a function of improving coating properties of the composition.
(3-1) 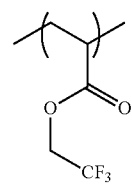
(3-2) 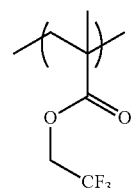
(3-3) 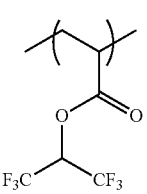
(3-4) 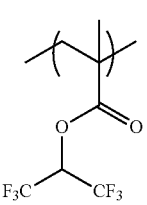

(3-5)
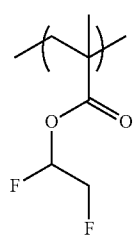

(3-6)
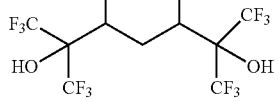

Examples of monomers constituting the structural unit of Formula (4) include 2-hydroxypropyl (meth)acrylate, 2-hydroxy-3-phenoxypropyl (meth)acrylate, 2-hydroxy-3-chloropropyl (meth)acrylate, N-(2-hydroxypropyl) (meth)acrylamide, and 3-(perfluorobutyl)-2-hydroxypropyl (meth)acrylate. In addition, examples of the structural unit of Formula (4) include structural units of Formula (4-1) to Formula (4-12) below.

(4-1)
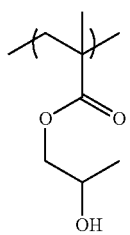

(4-2)
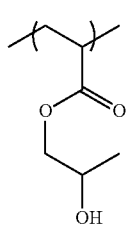

(4-3)
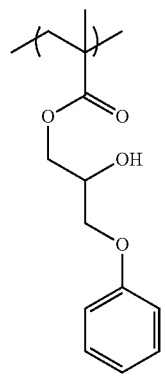

(4-4)
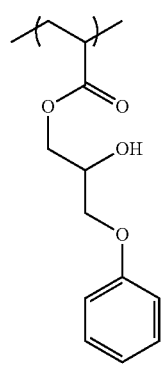

(4-5)
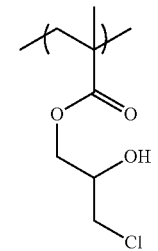

(4-6)
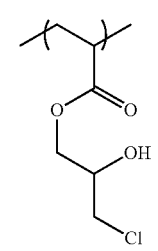

(4-7)
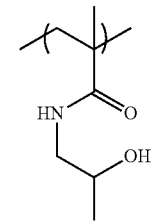

(4-8)

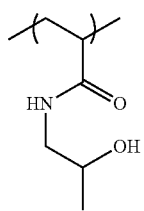

(4-9)

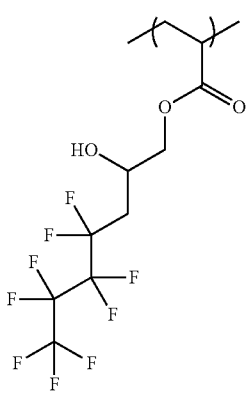

(4-10)

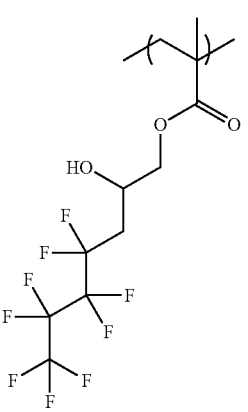

(4-11)

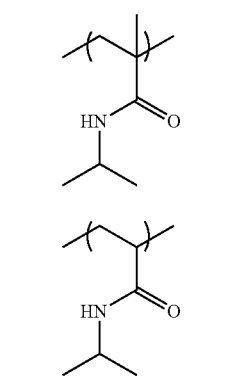

(4-12)

[Crosslinking agent] The resist underlayer film-forming composition of the present invention further includes a crosslinking agent. Examples of the crosslinking agent include hexamethoxymethyl melamine, tetramethoxymethyl benzoguanamine, 1,3,4,6-tetrakis(methoxymethyl)glycoluril (POWDERLINK1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl) urea, and 1,1,3,3-tetrakis(methoxymethyl)urea. A content of the crosslinking agent is, for example, 1% by mass to 50% by mass, with respect to the copolymer.

[Organic acid catalyst] The resist underlayer film-forming composition of the present invention further includes an organic acid catalyst. The organic acid catalyst is a catalyst component that promotes a crosslinking reaction. Examples of the organic acid catalyst include a sulfonic acid compound and a carboxylic acid compound such as p-toluenesulfonic acid, trifluoromethanesulfonic acid, pyridinium-p-toluenesulfonate, pyridinium-p-hydroxybenzenesulfonate, salicylic acid, camphorsulfonic acid, 5-sulfosalicylic acid, 4-chlorobenzenesulfonic acid, 4-phenolsulfonic acid, methyl 4-phenolsulfonate, benzenedisulfonic acid, 1-naphthalenesulfonic acid, citric acid, benzoic acid and hydroxybenzoic acid. Such organic acid catalysts may be included alone or two or more types thereof may be included in combination. A content of the organic acid catalyst is, for example, 0.1% by mass to 20% by mass, with respect to the crosslinking agent.

[Solvent] The resist underlayer film-forming composition of the present invention further includes a solvent. Examples of the solvent include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and mixtures of two or more types selected from among such solvents. A content of the solvent is, for example, 50% by mass to 99.5% by mass, with respect to the resist underlayer film-forming composition.

[Other additives] The resist underlayer film-forming composition of the present invention may further include a surfactant as necessary. The surfactant is an additive for improving coating properties of the resist underlayer film-forming composition with respect to a substrate. A known surfactant such as a nonionic surfactant and a fluorine-based surfactant can be used. Specific examples of the surfactant include a nonionic surfactant, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octyl phenyl ether, polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, a fluorine-based surfactant such as Eftop [registered trademark] EF301, Eftop EF303, Eftop EF352 (available from Mitsubishi Materials Electronic Chemicals Co., Ltd.), MEGAFACE [registered trademark] F171, MEGAFACE F173, MEGAFACE R-30, MEGAFACE R-40, MEGAFACE R-40-LM (available from DIC Corporation), Fluorad FC430, Fluorad FC431 (available from Sumitomo 3M Limited), Asahi-Guard [registered trademark] AG710, Surflon [registered trademark] S-382, Surflon SC101, Surflon SC102, Surflon SC103, Surflon SC104, Surflon SC105, Surflon SC106 (available from Asahi Glass Co., Ltd.), and organosiloxane polymer KP341 (available from Shin-Etsu Chemical Co., Ltd.). Such surfactants may be included alone and two or more types thereof may be included in combination. When the resist underlayer film-forming composition includes a surfactant, a content of the surfactant is, for example, 0.1% by mass to 5% by mass, and preferably 0.2% by mass to 3% by mass, with respect to the copolymer.

EXAMPLES

While the present invention will be described below in further detail with reference to examples, the present invention is not limited to the following examples.

A weight average molecular weight shown in the following Synthesis Example 1 to Synthesis Example 3 in this specification is a result of measurement through gel permeation chromatography (hereinafter abbreviated as GPC in this specification). A GPC apparatus manufactured by Tosoh Corporation was used for measurement, and tetrahydrofuran (THF) was used as a solvent. In addition, degree of distribution shown in the following Synthesis Examples in this specification is calculated from the measured weight average molecular weight and number average molecular weight.

Synthesis Example 1

92.11 g of propylene glycol monomethyl ether was added to 18.33 g of 2-(O-[1'-methylpropylideneamino]carboxyamino)ethyl methacrylate (available from Showa Denko K.K., product name: Karenz [registered trademark] MOI-BM), 10.00 g of adamantyl methacrylate (available from Osaka Organic Chemical Industry Ltd.), 7.14 g of 1,1,1,3,3,3-hexafluoroisopropyl methacrylate (available from Tokyo Chemical Industry Co., Ltd.) and 1.53 g of 1-dodecanethiol (available from Tokyo Chemical Industry Co., Ltd.) and the inside of a flask was then purged with nitrogen, and the temperature was raised to 70° C. 1.24 g of azobisisobutyronitrile (AIBN) dissolved in 60.87 g of propylene glycol monomethyl ether was added as a polymerization initiator into the flask under a nitrogen pressure and reacted for 24 hours to obtain a solution containing a copolymer having a structural unit of the following Formula (1-2), a structural unit of the following Formula (2-9) and a structural unit of the following Formula (3-4). GPC analysis was performed on the obtained solution containing a copolymer, and the copolymer in the solution had a weight average molecular weight of 6,070 and a degree of distribution of 1.98 in terms of polystyrene standards.

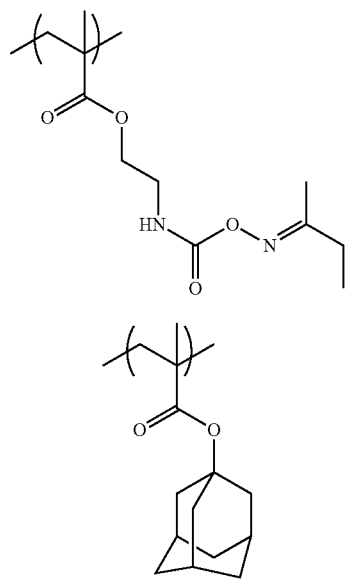

Synthesis Example 2

38.23 g of propylene glycol monomethyl ether was added to 7.00 g of 2-(O-[1'-methylpropylideneamino]carboxyamino)ethyl methacrylate (available from Showa Denko K.K., product name: Karenz [registered trademark] MOI-BM), 1.96 g of N-isopropylacrylamide (available from Tokyo Chemical Industry Co., Ltd.), 2.73 g of 1,1,1,3,3,3-hexafluoroisopropyl methacrylate (available from Tokyo Chemical Industry Co., Ltd.) and 1.53 g of 1-dodecanethiol (available from Tokyo Chemical Industry Co., Ltd.) and the inside of a flask was then purged with nitrogen, and the temperature was raised to 70° C. 0.47 g of azobisisobutyronitrile (AIBN) dissolved in 23.25 g of propylene glycol monomethyl ether was added as a polymerization initiator into the flask under a nitrogen pressure and reacted for 24 hours to obtain a solution containing a copolymer having a structural unit of the following Formula (1-2), a structural unit of the following Formula (4-12) and a structural unit of the following Formula (3-4). GPC analysis was performed on the obtained solution containing a copolymer, and the copolymer in the solution had a weight average molecular weight of 5,996 and a degree of distribution of 1.85 in terms of polystyrene standards.

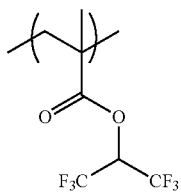

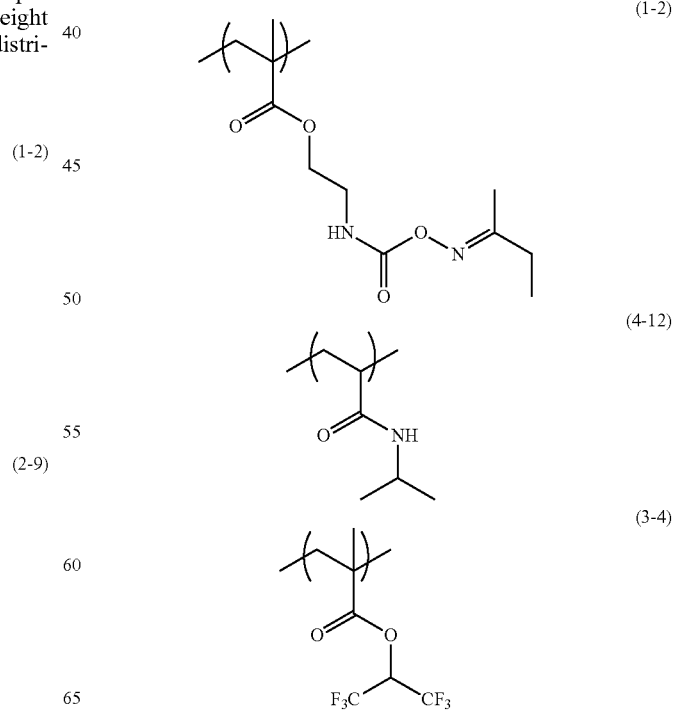

Synthesis Example 3

20.00 g of terephthalic acid diglycidyl ester (available from Nagase ChemteX Corporation, product name: Denacol [registered trademark] EX711), 12.54 g of 5-hydroxyisophthalic acid (available from Tokyo Chemical Industry Co., Ltd.) and 1.28 g of ethyltriphenylphosphonium bromide (available from Sigma-Aldrich Co. LLC) were added to and dissolved in 135.27 g of propylene glycol monomethyl ether. After purging with nitrogen with respect to a reaction container, the mixture was reacted at 135° C. for 4 hours to obtain a polymer solution. White turbidity and the like did not occur in the polymer solution even when it was cooled to room temperature, and solubility in propylene glycol monomethyl ether was favorable. GPC analysis was performed, and the polymer in the obtained solution had a weight average molecular weight of 6,758 and a degree of distribution of 1.64 in terms of polystyrene standards. The polymer obtained in this synthesis example had a structural unit of the following Formula (5) and a structural unit of Formula (6).

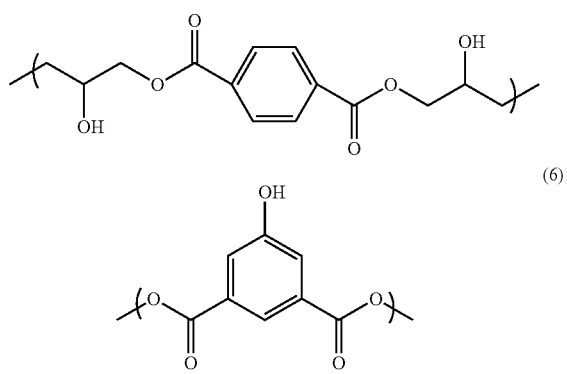

Example 1

0.018 g of tetramethoxymethylglycoluril (available from Cytec Industries Japan, product name: POWDERLINK1174) and 0.0025 g of pyridinium p-toluenesulfonate (available from Tokyo Chemical Industry Co., Ltd.) were mixed with 0.24 g of a solution containing 0.04 g of the copolymer obtained in Synthesis Example 1, and 20.76 g of propylene glycol monomethyl ether and 8.98 g of propylene glycol monomethyl ether acetate were added thereto and dissolved. Then, the mixture was filtered through a polyethylene microfilter with a pore diameter of 0.05 μm to obtain a resist underlayer film-forming composition for lithography.

Example 2

0.058 g of tetramethoxymethylglycoluril (available from Cytec Industries Japan, product name: POWDERLINK [registered trademark] 1174) and 0.0083 g of pyridinium p-toluenesulfonate (available from Tokyo Chemical Industry Co., Ltd.) were mixed with 0.82 g of a solution containing 0.13 g of the copolymer obtained in Synthesis Example 2, and 55.64 g of propylene glycol monomethyl ether and 23.94 g of propylene glycol monomethyl ether acetate were added thereto and dissolved. Then, the mixture was filtered through a polyethylene microfilter with a pore diameter of 0.05 μm to obtain a resist underlayer film-forming composition for lithography.

Comparative Example 1

0.039 g of tetramethoxymethylglycoluril (available from Cytec Industries Japan, product name: POWDERLINK [registered trademark] 1174), 0.0039 g of 5-sulfosalicylic acid (available from Tokyo Chemical Industry Co., Ltd.), and 0.00078 g of R-30 (available from DIC Corporation) were mixed with 0.98 g of a polymer solution containing 0.16 g of the polymer obtained in Synthesis Example 3, and 13.03 g of propylene glycol monomethyl ether and 5.94 g of propylene glycol monomethyl ether acetate were added thereto and dissolved. Then, the mixture was filtered through a polyethylene microfilter with a pore diameter of 0.05 μm to obtain a resist underlayer film-forming composition for lithography.

Test for Elution in Photoresist Solvent

The resist underlayer film-forming compositions for lithography prepared in Example 1, Example 2, and Comparative Example 1 were applied to silicon wafers as semiconductor substrates using a spinner. The silicon wafers were placed on a hot plate and baked at 205° C. for 1 minute to form resist underlayer films with a film thickness of 25 nm. These resist underlayer films were immersed in a solvent containing 70% by mass of propylene glycol monomethyl ether and 30% by mass of propylene glycol monomethyl ether acetate, and a test was performed to check whether they were insoluble in the solvent. As a result, there was no change in the film thickness between before immersion and after immersion.

Formation of Photoresist Pattern and Adhesion Test of Resist Pattern

The resist underlayer film-forming compositions for lithography prepared in Example 1 and Example 2 were applied, using a spinner, to silicon wafers on which a SiON film was formed by vapor deposition. The wafers were placed on a hot plate and baked at 205° C. for 1 minute to form a resist underlayer film with a film thickness of 5 nm. In addition, the resist underlayer film-forming composition for lithography prepared in Comparative Example 1 was applied, using a spinner, to a silicon wafer on which a SiON film was formed by vapor deposition. The wafer was placed on a hot plate and baked at 205° C. for 1 minute to form a resist underlayer film with a film thickness of 20 nm. A commercially available photoresist solution (available from Sumitomo Chemical Co., Ltd., product name: PAR855) was applied to the resist underlayer film using a spinner and heated on a hot plate at 105° C. for 60 seconds to form a photoresist film (with a film thickness of 0.10 μm).

Next, exposure was performed using a scanner manufactured by Nikon Corporation, NSR-S307E (with a wavelength of 193 nm, NA: 0.85, σ: 0.65/0.93 (Dipole)) at an optimal exposure amount through a photomask. The photomask was selected according to a resist pattern to be formed. After the exposure, a post exposure bake (PEB) was performed on a hot plate at 105° C. for 60 seconds, and after cooling, in a 60 second single paddle type process of industrial standards, developing was performed using a 0.26 N tetramethylammonium hydroxide aqueous solution as a developing solution. Through the above procedure, a resist pattern was formed. Table 1 shows results of formability of a line and space pattern (hereinafter abbreviated as L/S). When a desired L/S was formed, the result was "good."

In addition, when an exposure amount was incrementally increased from the optimal exposure amount, a line width of an L/S formed as a result according to an increase in exposure amount emitted to space parts of the L/S was gradually reduced. In this case, a line width of a line pattern in one step before the line pattern collapsed was set as a minimum size before collapse and used as an index of adhesion of the resist pattern. The results are shown in Table 1. A smaller value of the minimum size before collapse suggests stronger adhesion between the resist underlayer film and the resist pattern. In particular, when the line width of the resist pattern was fine, a difference of 1 nm was severe. Therefore, it is particularly preferable that the minimum size before collapse be smaller, even if only by 1 nm.

TABLE 1

|  | Minimum size before collapse (nm) | Formability of L/S |
| --- | --- | --- |
| Example 1 | 43 nm | Good |
| Example 2 | 43 nm | Good |
| Comparative Example 1 | 46 nm | Good |

The invention claimed is:

1. A resist underlayer film-forming composition for lithography comprising
a copolymer having a structural unit of the following Formula (1), a structural unit of the following Formula (2), and a structural unit of the following Formula (3),
a crosslinking agent,
an organic acid catalyst, and
a solvent:

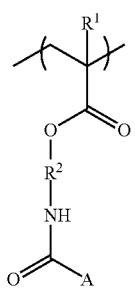

(1)

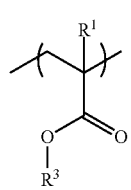

(2)

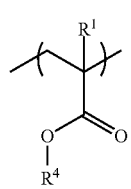

(3)

wherein
R$^1$s are independently a hydrogen atom or a methyl group,
R$^2$ is a C$_{1-3}$ alkylene group,
A is a protective group,
R$^3$ is an organic group having a 4-membered ring to 7-membered ring lactone framework, adamantane framework, tricyclodecane framework or norbornane framework, and
R$^4$ is a linear, branched or cyclic organic group having a carbon atom number of 1 to 12 in which at least one hydrogen atom is substituted with a fluoro group and which optionally has at least one hydroxy group as a substituent.

2. A resist underlayer film-forming composition for lithography comprising
a copolymer having a structural unit of the following Formula (1), a structural unit of the following Formula (4), and a structural unit of the following Formula (3),
a crosslinking agent,
an organic acid catalyst, and
a solvent:

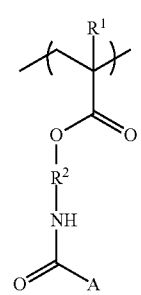

(1)

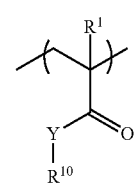

(4)

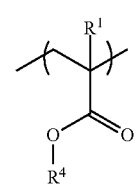

(3)

wherein
R$^1$s are independently a hydrogen atom or a methyl group,
R$^2$ is a C$_{1-3}$ alkylene group,
A is a protective group,
Y is a —O-group or —NH-group,
R$^{10}$ is a linear or branched alkyl group or hydroxyalkyl group having a carbon atom number of 1 to 12 in which at least one hydrogen atom is optionally substituted with a fluoro group or a chloro group and which optionally has a phenoxy group as a substituent, and
R$^4$ is a linear, branched or cyclic organic group having a carbon atom number of 1 to 12 in which at least one hydrogen atom is substituted with a fluoro group and which optionally has at least one hydroxy group as a substituent.

3. The resist underlayer film-forming composition for lithography according to claim 1,
wherein the structural unit of Formula (1) is a structural unit of the following Formula (1a), a structural unit of the following Formula (1b), a structural unit of the following Formula (1c), or a structural unit of the following Formula (1d):

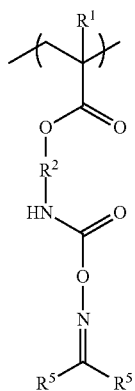
(1a)

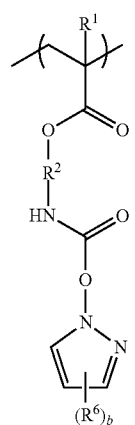
(1b)

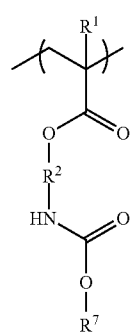
(1c)

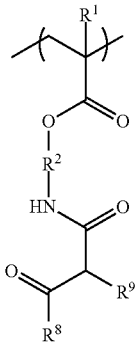
(1d)

wherein
$R^1$ and $R^2$ have the same meanings as $R^1$ and $R^2$ in Formula (1),
two $R^5$s are independently a hydrogen atom, a methyl group or an ethyl group,
$R^6$ is a methyl group or an ethyl group,
b is an integer of 0 to 3,
$R^7$ is a linear or branched alkyl group having a carbon atom number of 1 to 6 or a linear or branched alkoxyalkyl group having a carbon atom number of 1 to 6,
$R^8$ is a linear or branched alkoxy group having a carbon atom number of 1 to 6, and
$R^9$ is a hydrogen atom or a linear or branched alkoxycarbonyl group having a carbon atom number of 2 to 6.

4. The resist underlayer film-forming composition for lithography according to claim 1,
wherein the copolymer has a weight average molecular weight of 1,500 to 20,000.

5. A method of forming a resist pattern, comprising:
a process of applying the resist underlayer film-forming composition for lithography according to claim 1 to a substrate and performing baking to form a resist underlayer film with a thickness of 1 nm to 25 nm;
a process of applying a resist solution to the resist underlayer film and performing heating to form a resist film;
a process of exposing the resist film with radiated light selected from the group consisting of a KrF excimer laser, an ArF excimer laser and an extreme ultraviolet ray through a photomask; and
a process of performing development with a developing solution after the exposure.

6. The resist underlayer film-forming composition for lithography according to claim 1,
wherein the copolymer has a structure consisting of the structural unit of the Formula (1), a structural unit of the Formula (2), and a structural unit of the Formula (3).

7. The resist underlayer film-forming composition for lithography according to claim 2,
wherein the copolymer has a structure consisting of the structural unit of the Formula (1), the structural unit of the Formula (4), and the structural unit of the Formula (3).

* * * * *